United States Patent
Falcone

[19]

[11] Patent Number: 6,135,341
[45] Date of Patent: Oct. 24, 2000

[54] ROOM TEMPERATURE GOLD WIRE WEDGE BONDING PROCESS

[75] Inventor: Robert J. Falcone, Taipei, Taiwan

[73] Assignee: Texas Instruments Incorporated, Dallas, Tex.

[21] Appl. No.: 09/321,353

[22] Filed: May 27, 1999

Related U.S. Application Data

[60] Provisional application No. 60/086,881, May 27, 1998, abandoned.

[51] Int. Cl.[7] .............................. B23K 1/06; B23K 5/20; B23K 20/10; B23K 31/02
[52] U.S. Cl. .................................. 228/110.1; 228/180.5
[58] Field of Search .............................. 228/110.1, 180.5

[56] References Cited

U.S. PATENT DOCUMENTS

| | | | |
|---|---|---|---|
| 5,186,378 | 2/1993 | Alfaro | 228/110 |
| 5,201,454 | 4/1993 | Alfaro et al. | 228/110 |
| 5,244,140 | 9/1993 | Ramsey et al. | 228/110.1 |

FOREIGN PATENT DOCUMENTS

| | | |
|---|---|---|
| 0535433A2 | 8/1997 | European Pat. Off. . |
| 0791955A2 | 8/1997 | European Pat. Off. . |
| 410032230 | 8/1997 | Japan . |

*Primary Examiner*—Patrick Ryan
*Assistant Examiner*—Zidia T. Pittman
*Attorney, Agent, or Firm*—Wade James Brady, III; Frederick J. Telecky, Jr.

[57] ABSTRACT

A method of forming a bond structure wherein there are provided a conductive aluminum bond site (15), a gold wire (13) and a wedge bond tool (11). The gold wire is made to contact the aluminum bond site to provide an interface of the gold wire and the aluminum bond site. A mashing force (9) is applied at the interface with the wedge bond tool and ultrasonic energy (5,7) at an ultrasonic frequency above 165 KHz and preferably 193 KHz is applied at the interface for a period sufficient to cause bonding of the gold wire and the aluminum bond site with the application of ultrasonic energy commencing with the interface at room temperature, generally from about 15° C. to about 25° C. The ultrasonic frequency is generally applied for a period from about 0.5 to about 10 milliseconds.

16 Claims, 1 Drawing Sheet

ROOM TEMPERATURE GOLD WIRE WEDGE BONDING PROCESS

This application claims priority under 35 USC 119(e)(1) of provisional application Ser. No. 60/086,881 filed May 27, 1998 now abandoned.

BACKGROUND OF THE INVENTION

1. Field of the Invention

This invention relates to a process for wedge bonding gold wire to an aluminum bond pad at room temperature without the use of a heated work holder to enhance required bond adhesion.

2. Brief Description of the Prior Art

An integral procedure required in the fabrication of semiconductor devices is that of bonding of wires to bond pads and the like. Several factors must be addressed in the wire bonding procedure, among these factors being adequacy of adhesion of the bonded parts to each other, possible reaction between or among the materials involved, the time required to complete the bonding operation and the conditions under which bonding is to take place.

One highly successful bonding procedure is ultrasonic bonding. Ultrasonic bonding has been accomplished in the prior art at various frequencies up to about 125 KHz in the prior art. Such bonds have principally been made between gold bond wires and aluminum or aluminum alloy surfaces on integrated circuits. Interconnections have been made between aluminum wires and aluminum surfaces, however these interconnections have generally been made at a frequency of about 60 KHz. Such interconnections are described in a paper entitled "Effect of Ultrasonic Vibration on Wire Bonding" by Hiroshi Haji et al., Department of Materials Science and Technology, graduate School of Engineering Sciences, Kyushu University, Kasuga, Fukuoka, Japan. The aluminum to aluminum interconnections made at this lower frequency has not produced a sufficient metal interchange between the bond wire and the bond surface to produce a strong bond. Hence, a process is required to achieve, through metal interchange, a strong bond wire to bond surface connection at lower temperature.

Bonds have been made at 120 KHz as described in an article in the *ICEMM Proceedings of* 1993, "High Reliability Wire Bonding Technology by the 120 KHz Frequency of Ultrasonic", by Yuji Shirai et al. This article shows a reduced wire bond failure rate at 120 KHz and discusses gold wedge bonding at room temperature.

U.S. Pat. No. 5,660,319, which is assigned to the assignee of the subject application, provides an improvement over the prior art thereto by bonding an aluminum wire to an aluminum bond site utilizing an ultrasonic power source that is in the range of 150 KHz to 165 KHz and approximately 162 KHz. A mash force is applied from a pressure source during bonding. A metal exchange takes place between the aluminum wire and the aluminum bond site during the application of the ultrasonic power to produce a strong bond between the aluminum wire and the aluminum bond site.

A problem with prior art wedge bonding techniques is that such techniques have not provided ideal bonding conditions when used in conjunction with bonding of gold to aluminum. The bonding has taken place at elevated temperatures with present techniques requiring a heated work holder which is heated in the range of from about 120 to about 220 degrees C. to accommodate the needed interconnect. At such temperatures, the possibility of reactions taking place between or among the materials to be bonded is increased.

SUMMARY OF THE INVENTION

In accordance with the present invention, it is possible to provide, at room temperature and generally in the range of from about 15° C. to about 25° C. a gold wire wedge bond to an aluminum bond site or vice versa, it being understood that the procedure will operate at elevated temperatures requiring the application of heat as well. It should be understood that the aluminum can be pure or doped, such as, for example, with copper or silicon. Accordingly, when aluminum is referred to herein it should be understood to include the pure as well as the doped types thereof. The procedure does not include heating of the wire or the bond pad to which the bond is to be made. The procedure involves the use of a high frequency transducer operating at a frequency above 165 KHz and preferably at about 193 KHz, though the frequency required in a specific case may vary, depending upon the package material and welding characteristics. The advantages obtained by this procedure are reduction of typical process temperatures during packaging which allows the use of alternative plastic packaging materials that can decrease the cost of packaging. Also, standard aluminum wire wedge bonders can be used to process the gold wire without conversion of the style of a heated work holder. In addition, the potential for "purple plague" is eliminated since there can be no overtemperature at the bond work station.

The bond is formed in accordance with the present invention by contacting the bond end of the gold wire with the aluminum bond sight with the interface of the bond end of the gold wire and the aluminum bond site being at about room temperature. With the interface being at about room temperature, a pulse of ultrasonic energy above 165 KHz. and preferably about 193 KHz is applied at the interface for a period sufficient to allow the metal from the wire and the bond pad to produce intermetallics or an interconnection to provide acceptable bond adhesion. This procedure generally takes from about 0.5 to about 10 milliseconds and is an integral function depending upon the ultrasonic energy received from the ultrasonic transducer and many other known factors. It should be understood that the factors involved in bonding time include power provided by the ultrasonic transducer, wire hardness and diameter, materials involved, etc.

DESCRIPTION OF THE PREFERRED EMBODIMENT

Figure 1:
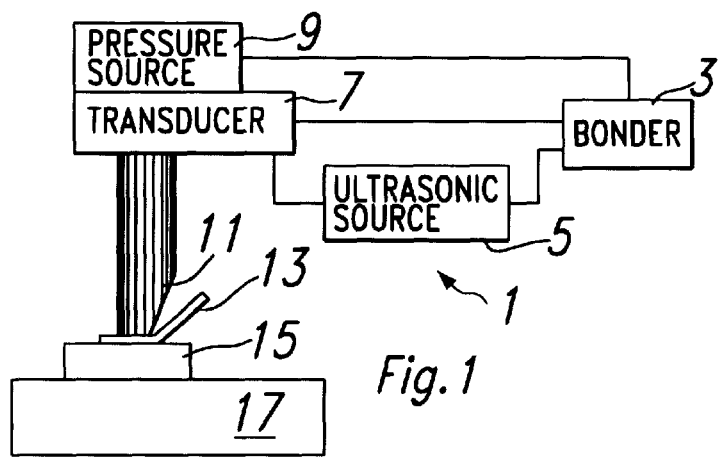
FIG. 1 is a schematic diagram of a standard ultrasonic bonding apparatus which can be used in accordance with the present invention.

Referring to FIG. 1, there is shown atypical ultrasonic bonding apparatus 1 which can be used in accordance with the present invention. The apparatus includes a bonder apparatus 3 for controlling the bonding operation, the bonder apparatus controlling an ultrasonic source 5, an ultrasonic transducer 7 which is coupled to a pressure source 9. The ultrasonic transducer 7 is coupled to a standard wedge bond tool 11.

Figure 2:
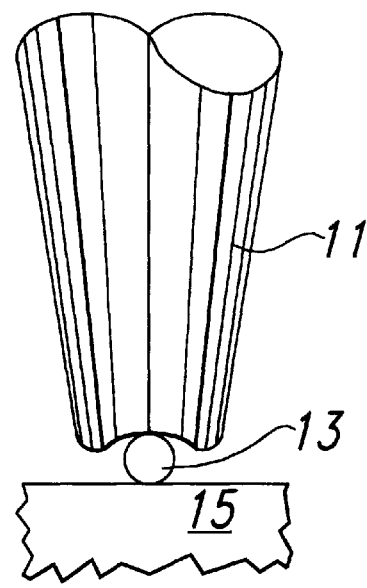
FIG. 2 is a schematic diagram of a bonding wedge and wire prior to bonding.
Figure 3:
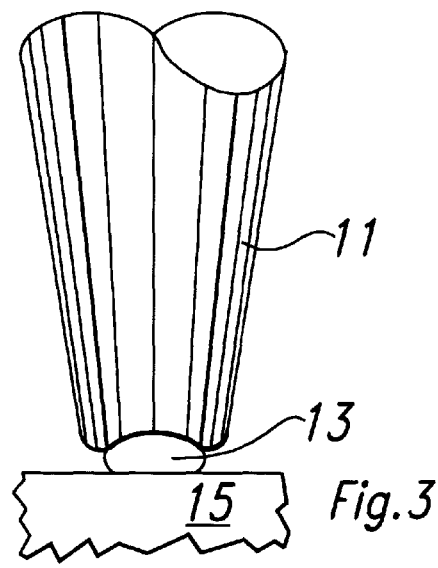
FIG. 3 is a schematic diagram of a bonding wedge and wire after bonding and application of a mashing force by the wedge bond tool.
Figure 4:
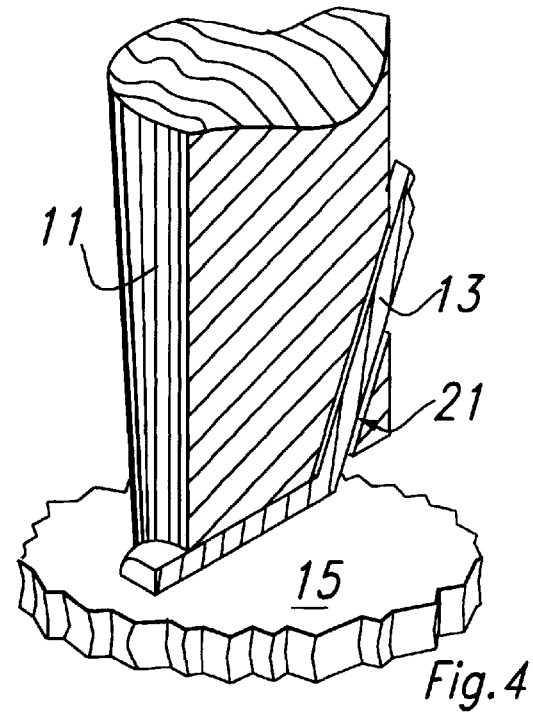
FIG. 4 is a cross sectional view of a bond wedge tool and wire.

In operation, a gold wire 13 is placed in contact with a bond pad 15 on a semiconductor chip 17. The pressure source 9 then forces the wedge bond tool 11 downward and against the gold wire 13 to provide a mash force and forces the gold wire to be in contact with the bond pad 15 to form an interface of the gold wire end and the bond pad as shown in FIG. 2. Then the ultrasonic transducer 7 is turned on for a period sufficient to provide the desired bond between the gold wire 13 and the bond pad 15 while the force from the wedge bond tool 11 is still being applied to also cause a flattening or mashing of the gold wire against the bond pad as shown in FIG. 3. The gold wire 13 can be fed through a groove or bore 21 in the wedge bond tool as shown in FIG. 4. The ultrasonic source provides an ultrasonic frequency above 165 KHz and preferably about 193 KHz. The wedge bond tool 13 is then retracted.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming a wedge bond structure, comprising the steps of:
   (a) providing a conductive aluminum bond site;
   (b) providing a gold wire;
   (c) contacting the gold wire to the aluminum bond site to provide an interface of gold wire and said bond site; and
   (d) applying ultrasonic energy at an ultrasonic frequency above 165 KHz at the interface for a period of time sufficient to cause bonding of said gold wire and said aluminum bond site with commencement of said application of ultrasonic energy being when said interface is at about room temperature.

2. The method of claim 1 wherein said ultrasonic frequency is about 193 KHz.

3. The method of claim 1 wherein said room temperature is from about 15° C. to about 25° C.

4. The method of claim 2 wherein said room temperature is from about 15° C. to about 25° C.

5. The method of claim 1 wherein said ultrasonic frequency is applied for a period from about 0.5 to about 10 milliseconds.

6. The method of claim 2 wherein said ultrasonic frequency is applied for a period from about 0.5 to about 10 milliseconds.

7. The method of claim 3 wherein said ultrasonic frequency is applied for a period from about 0.5 to about 10 milliseconds.

8. The method of claim 4 wherein said ultrasonic frequency is applied for a period from about 0.5 to about 10 milliseconds.

9. A method of forming a wedge bond structure, comprising the steps of:
   (a) providing a conductive aluminum bond site;
   (b) providing a gold wire;
   (c) providing a wedge bond tool;
   (d) contacting the gold wire to the aluminum bond site to provide an interface of said gold wire and said aluminum bond site;
   (e) applying a mashing force at said interface between said gold wire and said aluminum bond site with said wedge bond tool; and
   (f) applying ultrasonic energy at an ultrasonic frequency above 165 KHz at the interface for a period sufficient to cause bonding of said gold wire and said aluminum bond site with commencement of said application of ultrasonic energy being when said interface is at about room temperature.

10. A method of forming a bond structure comprising the steps of:
    (a) providing a conductive aluminum bond site;
    (b) providing a gold wire;
    (c) providing a wedge bond tool;
    (d) contacting the gold wire to the aluminum bond site to provide an interface of said gold wire and said aluminum bond site;
    (e) applying a mashing force at said interface with said wedge bond tool; and
    (f) applying ultrasonic energy at an ultrasonic frequency above 165 KHz at the interface for a period sufficient to cause bonding of said gold wire and said aluminum bond site with commencement of said application of ultrasonic energy being when said interface is at about room temperature;
    wherein said ultrasonic frequency is about 193 KHz.

11. The method of claim 9 wherein said room temperature is from about 15° C. to about 25° C.

12. The method of claim 10 wherein said room temperature is from about 15° C. to about 25° C.

13. The method of claim 9 wherein said ultrasonic frequency is applied for a period from about 0.5 to about 10 milliseconds.

14. The method of claim 10 wherein said ultrasonic frequency is applied for a period from about 0.5 to about 10 milliseconds.

15. The method of claim 11 wherein said ultrasonic frequency is applied for a period from about 0.5 to about 10 milliseconds.

16. The method of claim 12 wherein said ultrasonic frequency is applied for a period from about 0.5 to about 10 milliseconds.

* * * * *